United States Patent [19]

Poeppelman

[11] Patent Number: 4,692,923
[45] Date of Patent: Sep. 8, 1987

[54] FAULT TOLERANT MEMORY
[75] Inventor: Alan D. Poeppelman, Dayton, Ohio
[73] Assignee: NCR Corporation, Dayton, Ohio
[21] Appl. No.: 655,854
[22] Filed: Sep. 28, 1984
[51] Int. Cl.[4] ............................................ G06F 11/10
[52] U.S. Cl. ...................................... 371/38; 371/21; 365/201
[58] Field of Search ....................... 371/37, 38, 21, 10, 371/11; 365/230, 201, 222

[56] References Cited

U.S. PATENT DOCUMENTS

| | | | |
|---|---|---|---|
| 4,335,459 | 6/1982 | Miller | 371/38 |
| 4,412,314 | 10/1983 | Proebsting | 365/222 |
| 4,542,454 | 9/1985 | Breich | 371/38 |
| 4,562,576 | 12/1985 | Ratcliffe | 371/38 |
| 4,604,749 | 8/1986 | Shinoda | 371/38 |
| 4,617,660 | 10/1986 | Sakamoto | 371/38 |

Primary Examiner—Michael R. Fleming
Attorney, Agent, or Firm—Wilbert Hawk, Jr.; Casimer K. Salys

[57] ABSTRACT

A memory array architecture configured in one form with multiple subarrays addressable by row lines, bank select lines and column select lines, arranged so that no two data word bit positions have a common row line also share common bank select lines. The addition of isolation between the row lines and the row bus combined with the shifting or jogging of the bank select lines in adjacent subarrays ensures that a short circuit or open circuit in a row line no longer effects multiple bits in a common word. The ability to control the effects of manufacturing defects so that they commonly effect no more than a single bit position within a word makes feasible the use of error correction coding techniques within for example integrated circuit ROM type memories.

17 Claims, 8 Drawing Figures

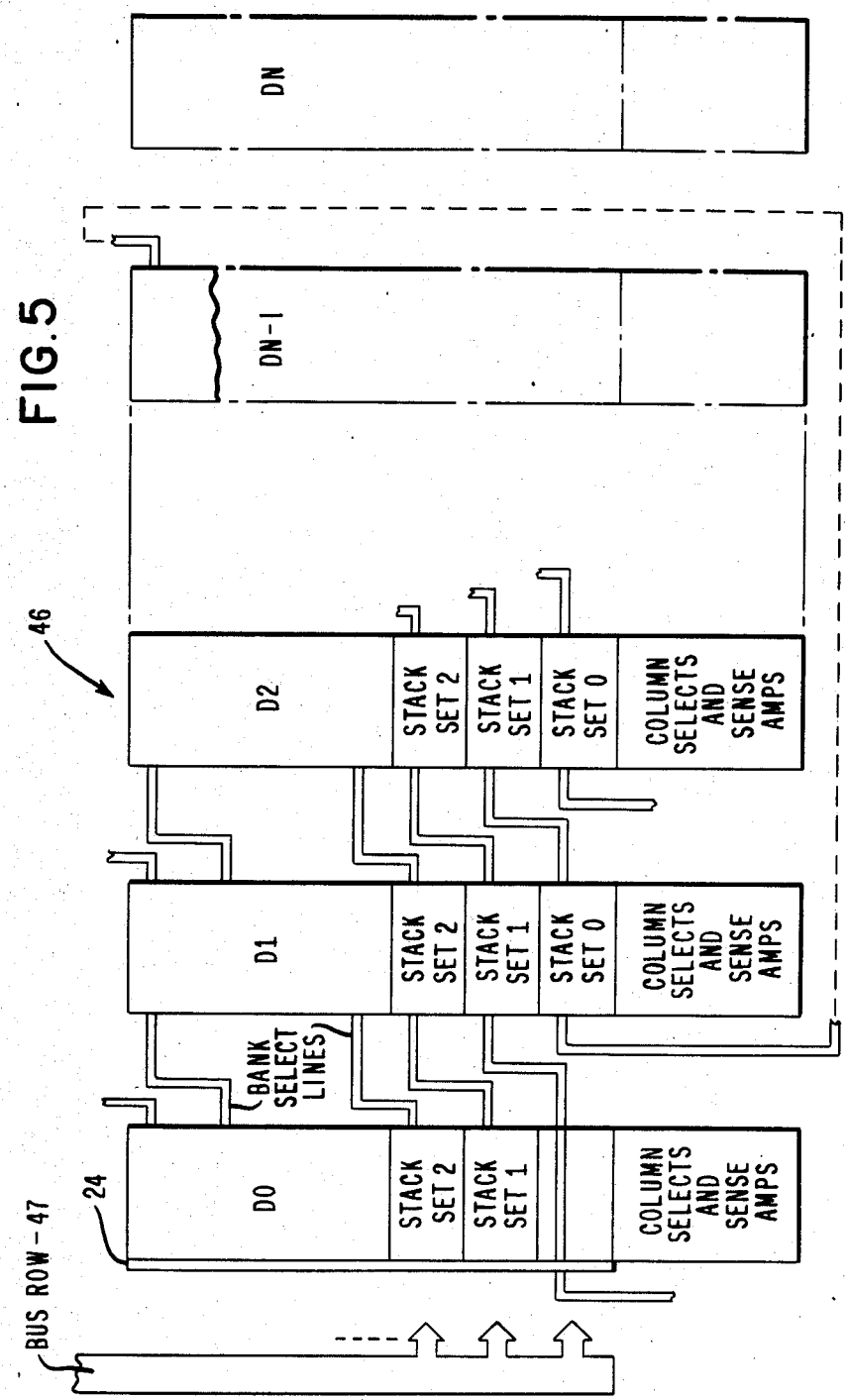

FAULT TOLERANT MEMORY

BACKGROUND OF THE INVENTION

This invention relates to memory arrays and more particularly to a class of memory arrays which by virtue of their structural architecture and error correction features are capable of efficiently compensating for production defects in the active devices and interconnects of the memory array.

The prior art is replete with structural configurations used to store binary information in both volatile and nonvolatile forms. Integrated circuit nonvolatile read only memories (ROM's), to which this invention most closely relates, are well known and commonly used in applications from simple pocket calculators to complex computers having artificial intelligence.

Generally, contemporary integrated circuit ROM's are configured from individual field effect transistors (FETs) arranged in rectangular arrays on a common integrated circuit chip, such that each transistor corresponds to a memory cell of the array. Data is extracted from the individual cells or transistors by selectively addressing the cells using row and column lines enabled in response to address signals coupled to the ROM row and column decodes. One prevalent construction of the ROM cells involves the use of field effect transistors which are selectively programmed to be either depletion or enhancement mode devices through a mask-defined ion implantation procedure imposed preferably late in the fabrication cycle. Such integrated circuit ROM's normally use polycrystalline silicon for the row conductors, which correspond to the gate electrodes of the cell FETs, use diffused layers for the ground conductors within the array, and use metal layers for the bit line conductors.

With the trend toward greater ROM densities and shorter access times, more elaborate ROM architectures have evolved. An example of such appears in U.S. Pat. No. 4,602,354, assigned to the assignee of the instant application. According to the architecture of that ROM, chip density is increased through the use of NAND configured FETs, in series arrangements called stacks, which are individually accessed and isolated by bank select and column select circuits. As may be appreciated from a reading that application, the invention therein sought to optimize the line pitch through a unique arrangement of the memory architecture.

Irrespective of which technique is employed to increase the ROM density, the successful delivery of the working integrated circuit ROM chips remains vulnerable to the process constrained fabrication yields. Because the probability of random defects is relatively constant for individual cell FETs, yield effects have a great impact on high density ROMs. In an effort to increase the effective yield of high density memory chips, some manufacturers have turned to the addition of spare rows or columns. However, such approaches are not practical for low to moderate cost ROMs in that the replacement of defective rows or columns with spares must be initiated very late in the fabrication cycle, namely after the main memory array is fabricated and tested for defects. Furthermore, it is no doubt apparent that the use of this technique requires the individualized modification of each ROM, based on the location of the defects in the main memory array of such ROM, and the reprogramming of the data into the spare rows and columns.

An alternate approach to increasing chip yield involves the use of error correction coding. As depicted in FIG. 1, a ROM 1 having main memory array 2 with individually programmed FETs 3, schematically depicted at crossing points by the symbols "X", are accessed by way of row decode 4 and column decode 6 to provide output data corresponding to word bits D0–D7. Note, however, that the configuration depicted includes supplemental error correction code memory array 7, with preprogrammed error correction code bits ECC0–ECC3, which are accessed concurrent with the addressing of main memory array 2. As implemented, data word bits D0–D7 are combined with error correction bits ECC0–ECC3 in error correcting logic 8 to generate a corrected data word having bits DC0–DC7.

Unfortunately, as is understood by those having skill in the art, the addition of four error correction bits per eight bit data word can correct no more than a single bit error in each addressed word D0–D7. This limitation becomes a distinct deficiency upon recognizing that a single short circuit in a row line of main memory array will by nature of standard architecture affect all data words selected by the row bus connected to such shorted row line. Thereby, a single row line defect can affect multiple bits in multiple words, and essentially destroy the value of the error correction circuitry. Though it is possible to decouple defective row lines and substitute spare rows in place thereof, in the manner noted earlier, the circuitry for implementing such isolation and substitution operations becomes prohibitive. This is especially true when one notes the degree to which size of the ROM chip of FIG. 1 has already been increased to provide error correction code memory array 7 and error correction logic 8.

Therefore, there remains an ever-increasing need for ROM designs which are capable of overcoming manufacturing defects in the main memory array with acceptable increases in ROM chip size.

BRIEF SUMMARY

According to the present invention, the tolerance of memories, and in particular ROM's, to manufacturing defects is improved by the cooperative use of error correction coding, row line isolation, and main memory array architecture refinements. In particular, as to the latter feature, the row and bank select line architecture has been configured to ensure that no two data word bits sharing a common row line have the same bank select lines. In this way, defects affecting a complete row line of the main memory 1, which would otherwise prevent the use of the error correction, are relegated to the class which can be corrected by the application of conventional error correction techniques.

Another aspect of the invention relates to the use of current limiting devices between the row bus and the numerous row lines connected to the row bus, to isolate short circuit type defects in a single row line from the remainder of the main memory array. With the defective row line isolated, the unique memory array architecture ensures that the individual cell FETs which are accessed by such defective row line, irrespective of whether the defect is caused by a row line short circuit or open circuit, are themselves not bits of a common data word. This latter feature is implemented by a main memory architecture in which the bank select lines select only a single bit from each row for each data word.

The preferred structure for isolating row lines from the row bus is based on the use of depletion FETs, disposed between the row bus and each row line connected thereto. The current limiting feature of the depletion FET avoids excessive loading of the row bus in the event a row line is shorted, yet ensures that charging and discharging of the row line during selection of the cell FETs in the row proceeds with minimum effect.

In one manner of practicing the composite invention, the main memory array of a ROM is divided into subarrays. The subarrays are accessed by row and bank select lines, in which the bank select lines are physically jogged or translated in progression through the column-adjacent subarrays of the main memory. Upon the selection of a data word using the combination of the row lines, bank select lines and column selects, the data word from the main memory array is comprised of bits which share neither the same row line nor the same bank select lines. In that way, the multiple errors associated with a defective row line can now be corrected by the error correction circuits on the chip.

DESCRIPTION OF THE DRAWINGS

FIG. 5 is an alternate embodiment of the present invention by which row lines and bank select lines are interlaced to provide feasible error correction.

DETAILED DESCRIPTION

It should be recognized from the beginning that the fundamental concepts which underlie the invention are not limited to the various ROM embodiments described hereinafter, but rather, have potential application to the architecture of memory arrays composed of cells having diverse retention characteristics.

Figure 1:
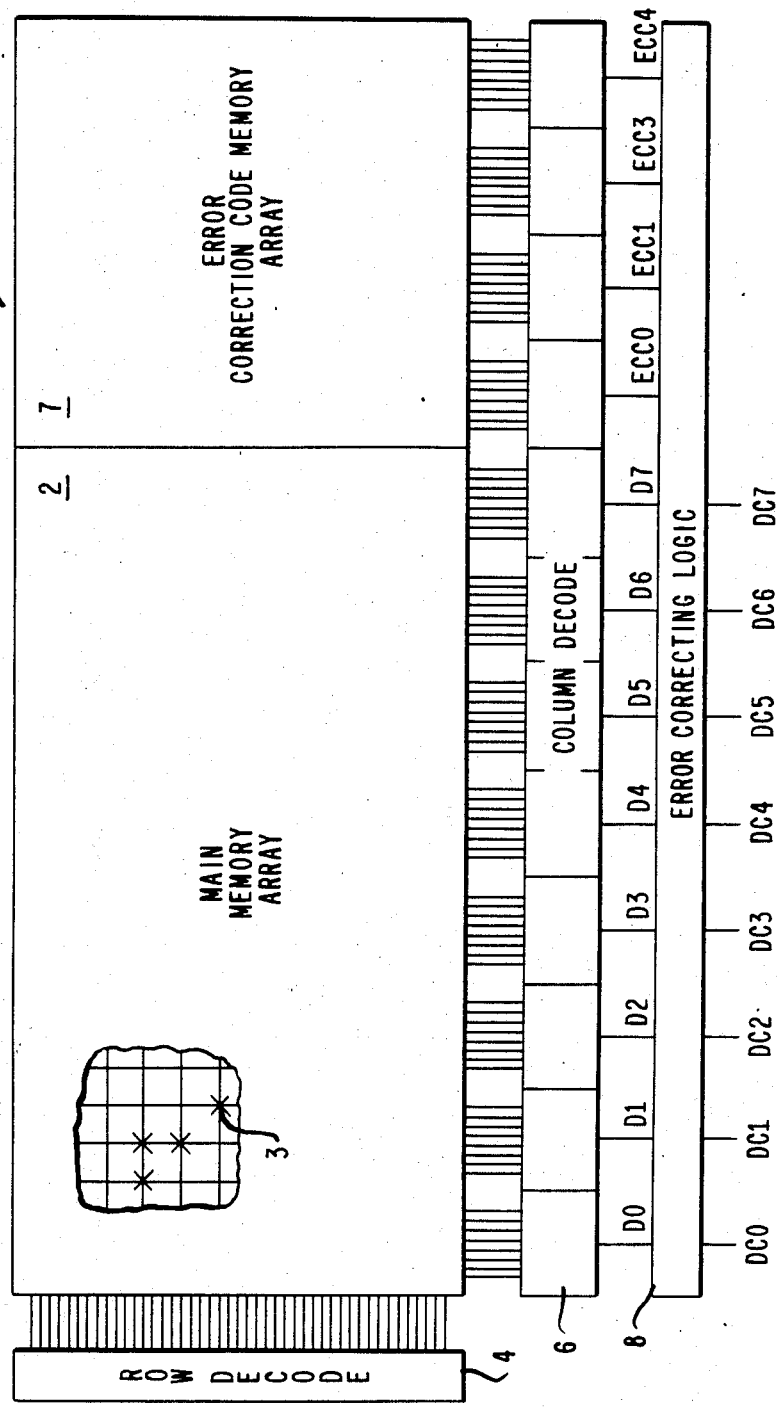
FIG. 1 is a schematic block diagram of a typical prior art ROM with error correction.
Figure 2:
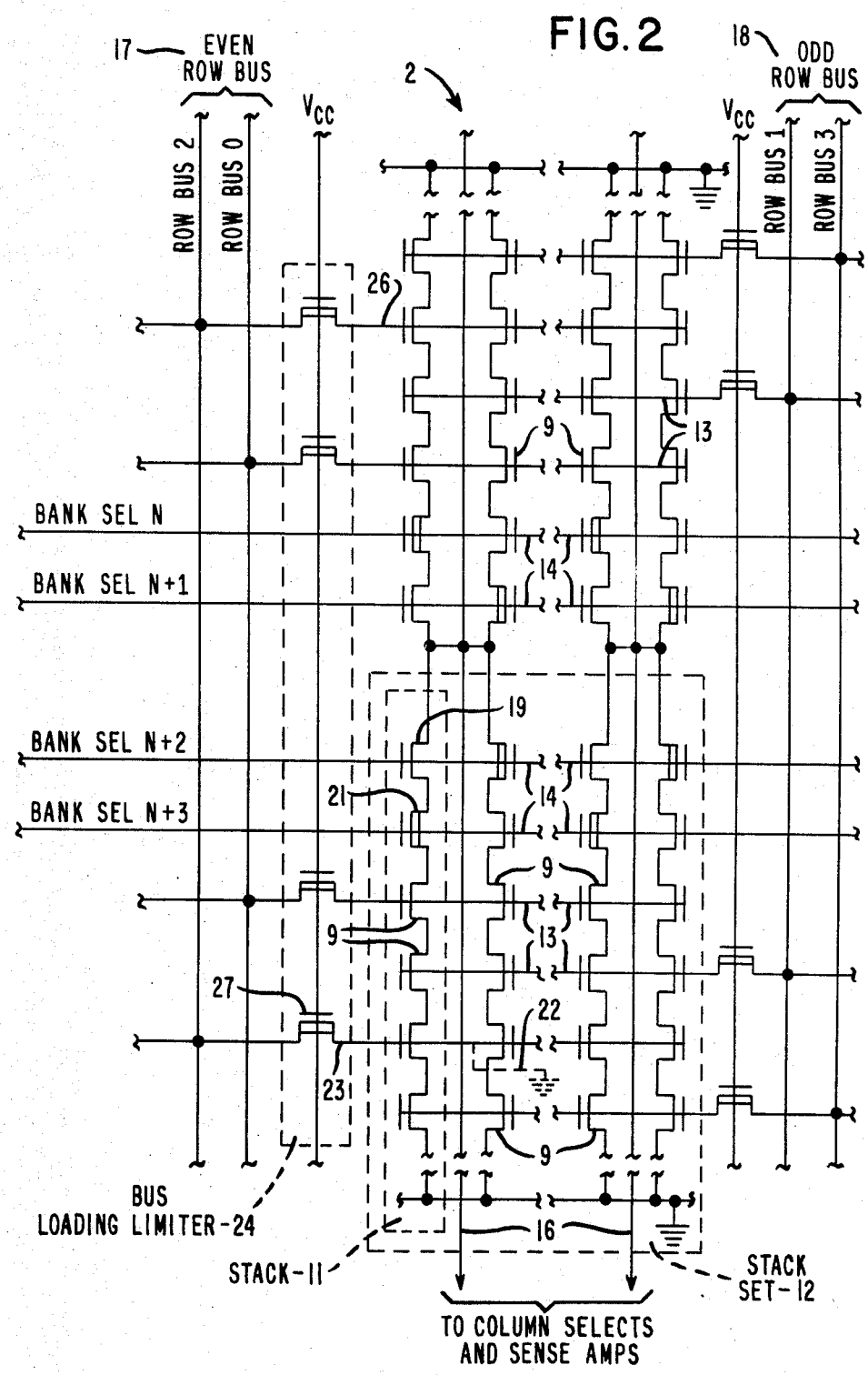
FIG. 2 is a schematic diagram of an NAND-OR section of a ROM current limiting depletion FETs disposed between the row bus and the row lines according to one aspect of this invention.

Attention is now directed to FIG. 2 of the drawings, where there appears one embodiment by which one aspect of the present invention is practiced. There appears in FIG. 2 a portion of a memory array, such as main memory array 2 in FIG. 1. As shown, array 2 is comprised of series-connected field effect transistors (FETs) 9 arranged in NAND logic stacks 11, which stacks 11 are themselves combined in pairs, often referred to as banks, and grouped into stack sets 12. Each data storage cell is comprised of a single FET. Stacks 11 and stack sets 12 are addressed by shared row lines 13, which according to the embodiment in FIG. 2 are common to all stacks in a stack set. Selection between adjacent stacks 11 within a stack set 12, bank selection, is performed by way of bank select lines 14, which lines are provided with electrical signals so that only one stack of the two adjacent stacks sharing a common column line 16 is addressed at any one time. Column selection and sensing of the signals on column line 16 proceeds in a manner commonly known to those routinely practicing in the art. Note, for the particular embodiment predicted in FIG. 2, column select line 16 is shared by more than two stacks, which stacks are individually enabled by different bank select lines numerically designated N through N+3 in the figure.

Briefly, the addressing of a FET cell within a stack, such as 11, would proceed as follows. One end of the stack is grounded as shown. Row address lines 13 for stack FETs 9 are driven by address signals conveyed over the combination of even row bus 17 and odd row bus 18 in such a way that non-selected rows are provided with a signal which makes them conductive, whereas the row line of the selected FET is provided with a signal which would not turn on an enhancement mode FET device. With that situation, only if the addressed FET were previously programmed during fabrication to be a depletion mode device would there exist a conductive path through the series connected ROM cell FETs within the stack. Clearly, to fully enable stack 11, bank select line N+2 must also be of such voltage that enhancement mode bank select FET 19 is conductive. This completes the conductive path between the ground and column select line 16. Note that alternate bank select FET 21 is a depletion mode device. One will no doubt understand that if a cell FET 9 in stack 11 at the addressed row is an enhancement mode FET device, the conductive path between column select line 16 and ground is open, and capable of being sensed as such by the sense amps connected to column line 16.

To appreciate one aspect of the invention, consider the situation where a manufacturing defect forms grounding type short circuit, depicted generally as 22, causing row line 23 to be permanently connected to ground potential. In that situation, without the presence of bus loading limiter block 24, the short circuit on row line 23 would also pull the corresponding line in row bus 2 to ground potential. Thereby, not only would all cells addressable by row line 23 be inoperative, the same situation would exist as to all corresponding row lines coupled to row bus 2, for instance row line 26. Foremost, note that absent bus loading limiter 24 the grounding effect would be coupled to laterally adjacent stack sets, which stack sets contain, in the context of standard memory array architectures, data for different bits in common data words. In this way, a single ROM defect affects multiple bits in a single data word, an error rate which makes the use of error correction coding techniques exceptionally inefficient.

To overcome one problem created by defect 22, in the context of the depicted memory array architecture, the present invention incorporates bus loading limiters 24, comprised of depletion mode field effect transistors connected between the row bus and each row line. As depicted, the depletion mode transistors are biased with supply voltage $V_{cc}$ to ensure that the full voltage which appears on the row bus is coupled through to the row line. The depletion mode transistor, such as FET 27 situated between row bus line 2 of even row bus 17 and row line 23, is by design sized to ensure that a short circuit defect such as 22 will have a limited degrading effect on an address voltage connected to row bus line 2. Thereby, row bus line 2 can provide an address voltage to other row lines, such as 26, notwithstanding the presence of the defect. It should also be recognized that the depletion FETs in bus loading limiter 24 provide a path for charging and discharging the capacitance of row line 23. For that reason, FET 27 must still be sufficiently large to conduct at a rate consistent with the access time of the memory array. Note that the row lines connected from odd row bus 18 are similarly coupled through depletion mode FETs to the interior of memory array 2.

Figure 3:
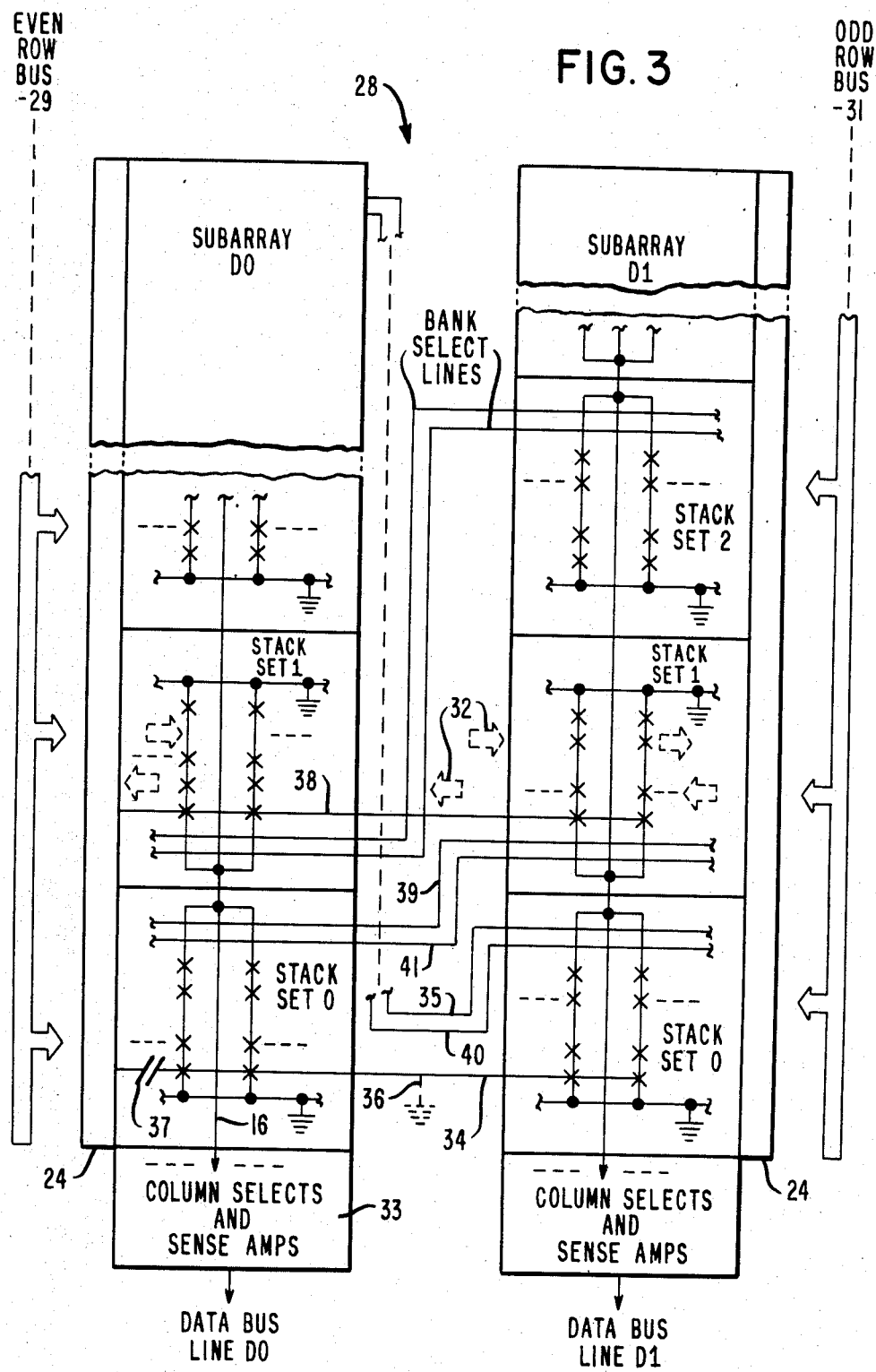
FIG. 3 is a schematic block diagram of one embodiment of the present invention, applied to subarrays of a main memory with the combination of current limiting and interlacing of bank select lines between stack sets.

Another aspect of the invention relates to the use of shared row and bank select lines in adjacent subarrays, such as subarrays D0 and D1 of memory array 28 in FIG. 3, which subarrays contribute individual data bits for data bus lines D0 and D1 in forming a common data word. Recall that a fundamental objective of this invention is to provide a memory array architecture which allows for an efficient utilization of error correction coding. In the context of the embodiment depicted in FIG. 3, this requires that a memory array defect not produce simultaneous errors in multiple bit positions, such as D0 and D1, of a common data word. FIG. 3 shows the presence of a memory array, generally 28, addressable by way of even row bus 29 and odd row bus 31, which respectively project row lines 32 through subarrays D0 and D1. Each subarray, such as D0, is itself comprised of multiple stack sets, which are themselves further comprised of paired stacks of NAND configured field effect transistors shown generally by the symbols "X". The stacks within memory array 28 are connected at one end to ground potential and the other end to column lines 16, which column lines are shared by correspondingly situated pairs of FETs with successive stack sets 0, 1, 2, etc. For example, column line 16 in subarray D0 is shared by a pair of stacks in stack set 0 as well as the corresponding stacks in stack set 1. It should further be understood that each subarray, such as subarray D0, includes a multiplicity of column lines 16, similarly connected to adjacent pairs of stacks in successive stack sets. The multiple column lines are connected to column selects and sense amps block 33 which senses the presence or absence of a conductive path in the addressed stack, and further selects according to the column address one of the multiple column lines 16 for connection to data bus line D0. Note that memory array 28 incorporates bus loading limiters 24 between even row bus 29 and the row lines projecting through subarrays D0 and D1, as well as for the odd row lines projecting from odd row bus 31. It should be without question that the ROM architecture depicted in FIG. 3 contemplates a multiplicity of additional subarrays.

Note that the architecture of memory array 28 as depicted in FIG. 3 incorporates a unique arrangement of the bank select lines. This architecture is consistent with the fundamental concept underlying the present invention, whereby a memory array is configured to ensure that a defect in a single row line affects no more than one bit of the data word read from the memory array. According to the embodiment depicted in FIG. 3, the bank select lines are shifted, jogged or translated with respect to the stack sets in progressing from one subarray to the next adjacent subarray. To more clearly understand this concept, consider a particular example from within memory array 28. Presume that there exists on row line 34 either a short circuit defect such as 36 or an open circuit defect such as 37, and that row line 34 is an even row line. In this situation, row line 34 would have a counterpart row line 38 in the stack set immediately above; namely, stack set 1, above stack set 0 within which row line 34 is situated. Were it not for the architecture of the present invention, if row line 34 were addressed, all signals connected to column line 16 and eventually selected by column selects and sense amps block 33 for both data bus lines D0 and D1 would be potentially incorrect. However, according to one aspect of the present invention, the defect in row line 34 does not affect corresponding row line 38 by virtue of the isolation provided by block 24. Furthermore, addressing of FETs by way of bank select lines 39 and 41 concurrent with the addressing of row line 34 may result in erroneous data on data bus line D0, but will not affect the data on data bus line D1. The difference is attributable to the absence of a defect on row line 38, which together with bank select lines 39 and 41 serves to address stack set 1 of subarray D1. Clearly, this same situation exists with respect to stack set 0 in subarray D1, which does convey potentially defective data to data bus line D1 during addressing by the combination of row line 34 and bank select lines 35 and 40, but by virtue of the jogging architecture provides the correct data to data bus line D0 of subarray D0.

It will no doubt be appreciated that all row lines could project from a common row bus on one side of the pair of subarrays, or that the stacks within the various stack sets could be arranged in a different configuration without affecting the outcome of the invention. Accordingly, the central feature is architectural arrangement by which no two subarrays storing different data word bits are addressed by the same row line and set of bank select lines.

Figure 4:
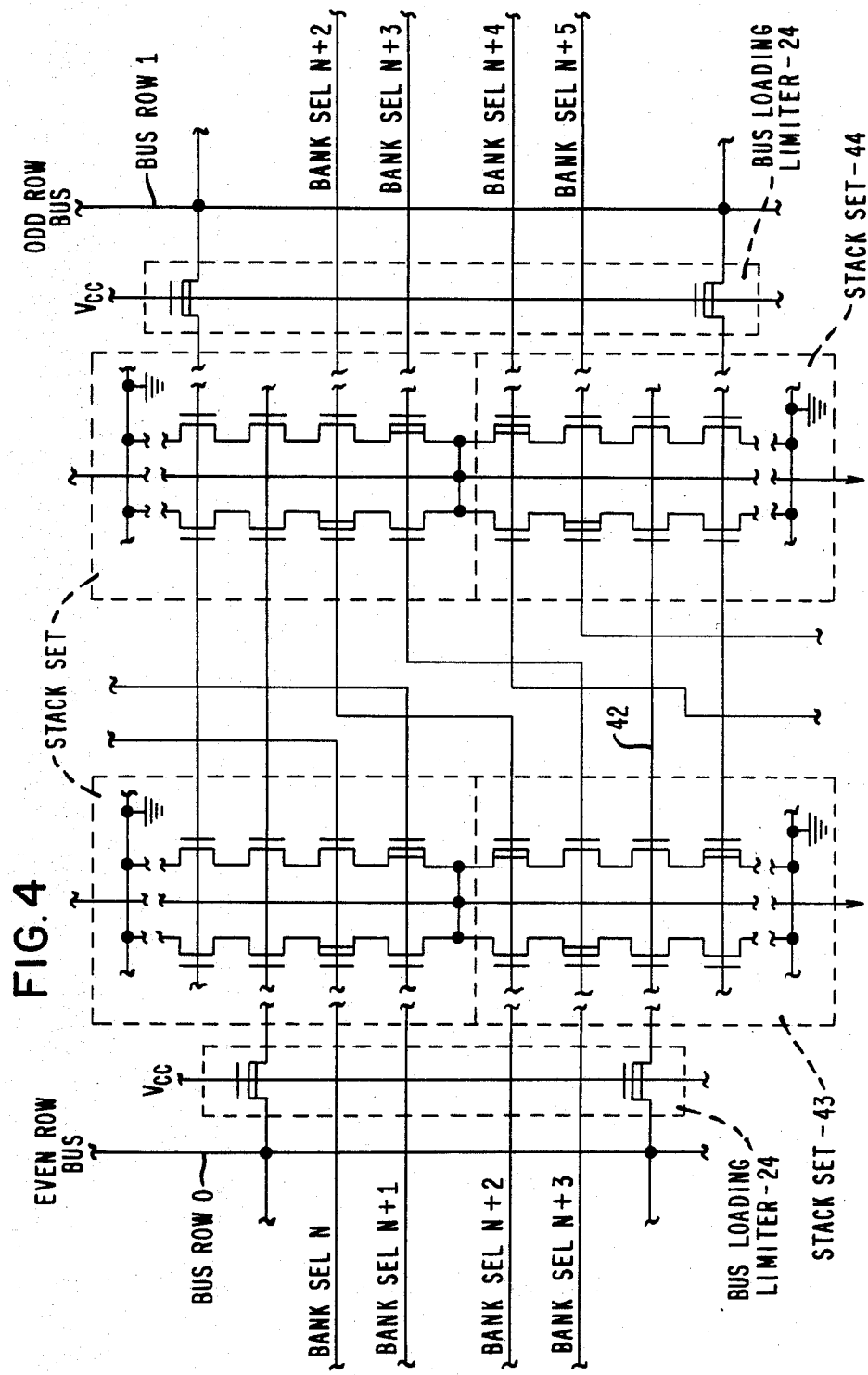
FIG. 4 is a schematic diagram of the FET arrangement within adjacent stack sets as depicted in FIG. 3.

FIG. 4 depicts in greater detail the architectural arrangement of adjacent stack sets from within memory array 28 depicted in FIG. 3. Note that the lines of the row bus are commonly connected to all adjacent stack sets. Further note that the bank select lines which address one stack set do not address FETs or cells in the immediately adjacent stack sets. For example, row line 42 is common to stack sets 43 and 44, whereas the bank select lines for stack 43 are numbered N+2 and N+3 while those for stack set 44 are numbered N+4 and N+5.

Another embodiment of the invention is depicted in FIG. 5. The architecture of this memory array, generally 46, differs from that depicted in FIGS. 3 and 4, primarily in the arrangement of row bus 47. Briefly referring back to FIG. 3, from a consideration of that arrangement it can be understood to allow bank select lines, such as 39 and 41, to jog back, downward, to address stack set 0 before entering an adjacent pair of subarrays, such as might be designated D2 and D3. Memory array 46 in FIG. 5 on the other hand is arranged with an architecture in which sets of row lines, coupled to row bus 47 through bus loading limiter 24, project the full width of the array. Namely, electrically isolated but logically identical sets of row lines originate at limiter 24 and project, horizontally in FIG. 5, through correspondingly numbered stack sets of memory array 46. With that row addressing architecture, the bank select lines corresponding to each stack set must jog or translate in staircase fashion between successive subarrays if the basic premise of the present invention is to be maintained. Namely, no two word bits, corresponding to two subarrays, can have the same row and bank select lines.

Figure 6A:
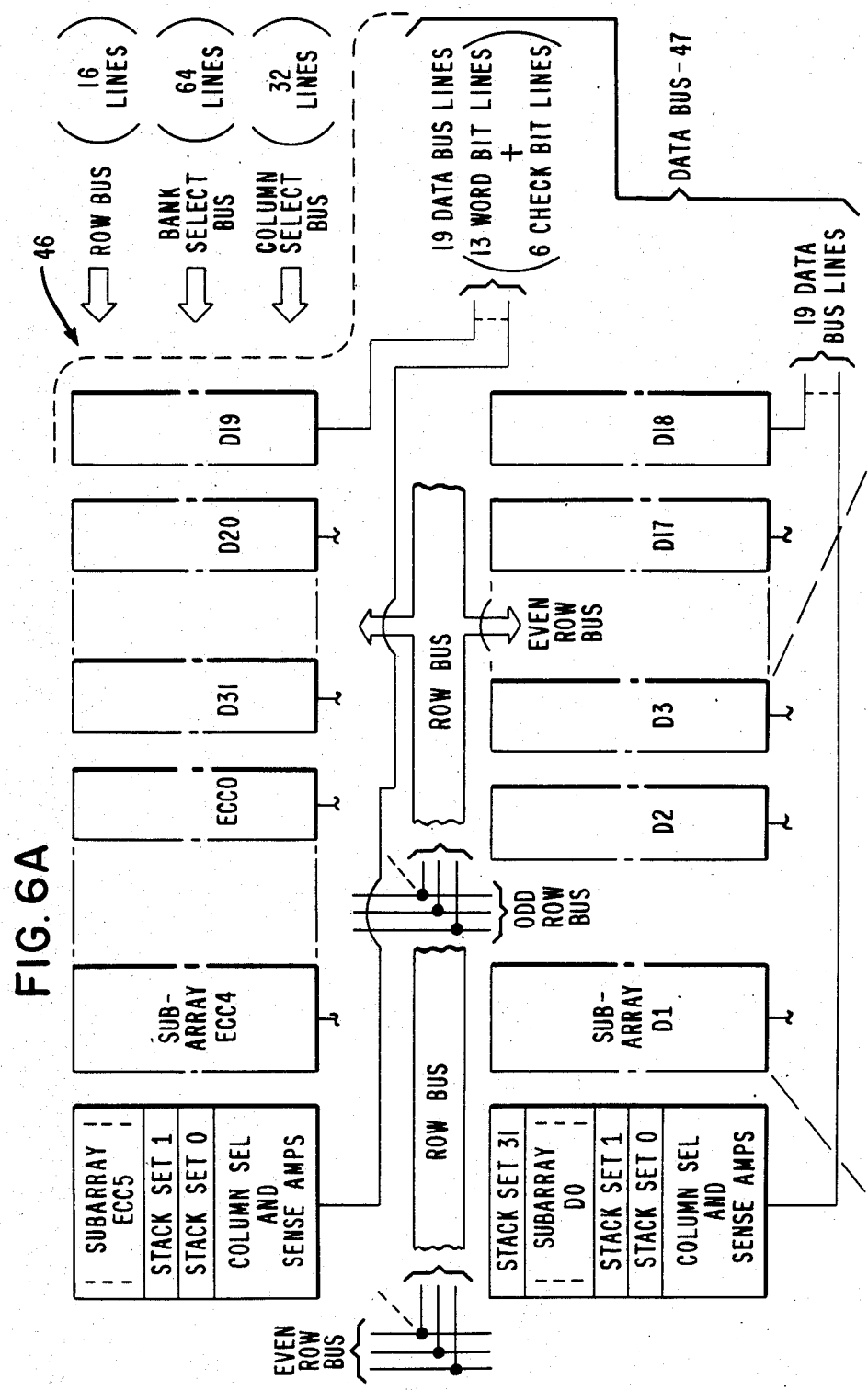
FIG. 6A. is a schematic block diagram using the features of the present invention to configure a one megabit ROM with error correction.
Figure 6B:
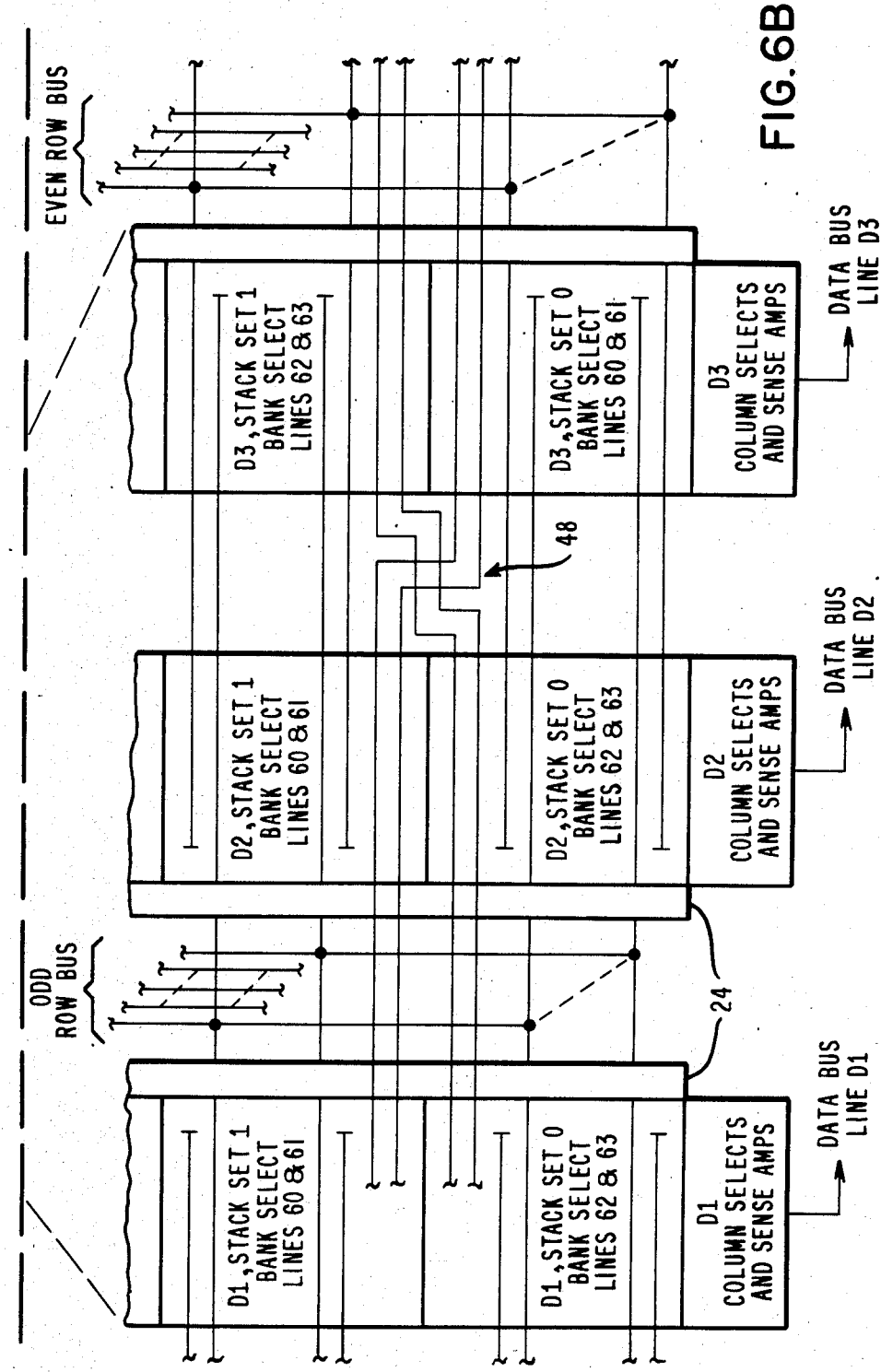
FIG. 6B is a magnification of one section within the ROM of FIG. 6A, to show a further embodiment of the interlace of row lines and bank select lines with respect to data word bits.
Figure 7:
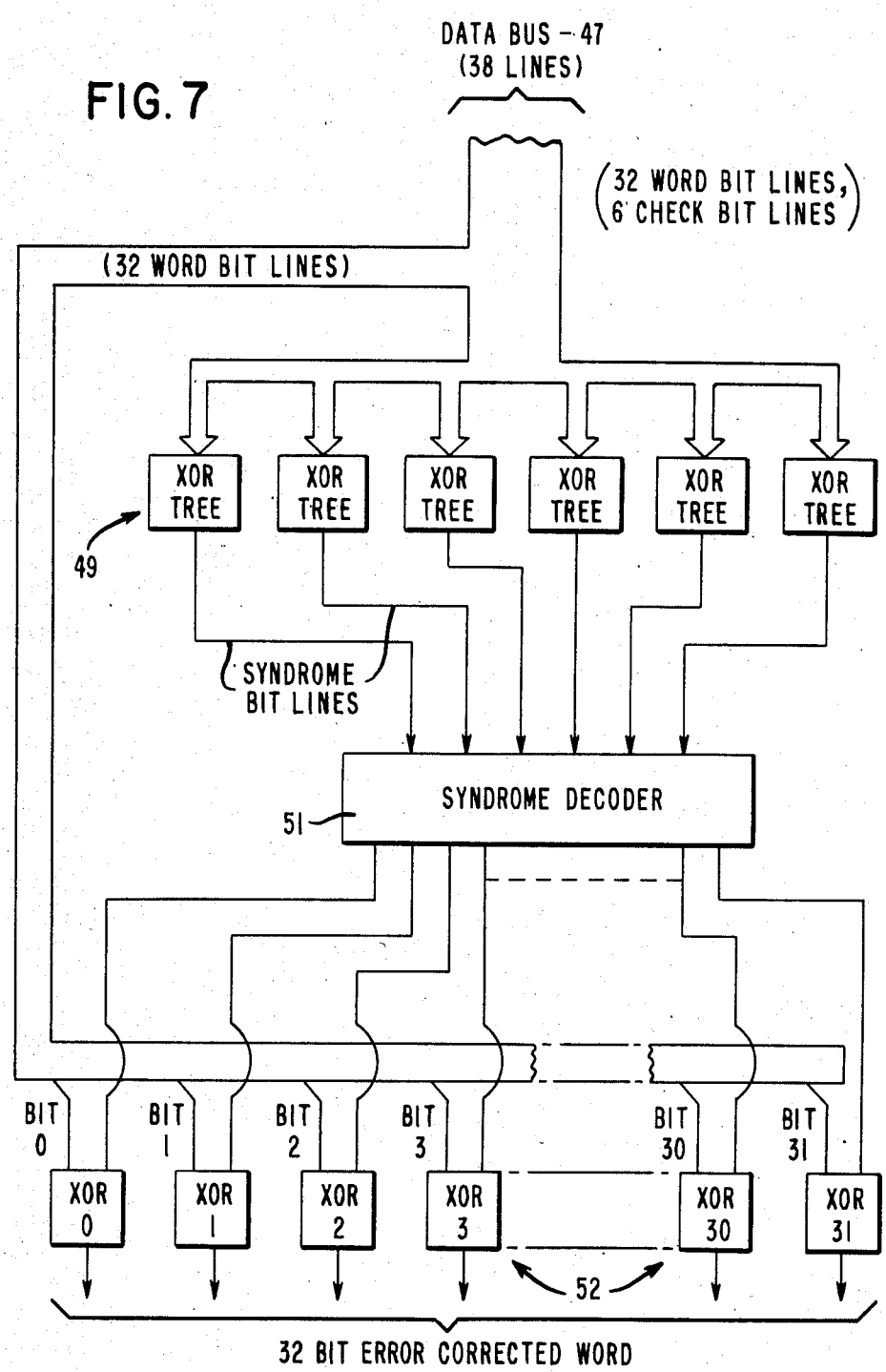
FIG. 7 is a schematic block diagram of the error correction circuitry associated with the one megabit ROM depicted in FIG. 6A.

FIG. 6A depicts the preferred architecture for a one megabit ROM based on an application of the features which characterize the present invention. FIG. 6B contains a magnification of subarrays D1-D3 of the memory array in FIG. 6A, while FIG. 7 depicts the error correction circuitry by which an error in a data bit position of the 32 bit data word is corrected. The memory array, generally at 46, stores 1,048,576 bits of binary data in an equal number of FET cells. In addition to the data bits stored in memory array 46, the array includes 196,608 bits of error correction code. As embodied, ROM 46 is addressed by 112 lines divided into 16 row bus lines, 64 bank select bus lines and 32 column select bus lines. The output of the array is a 38 bit word, appearing on a combined 38 line data bus 47. The data words themselves are composed of 32 data word bits and 6 check bits.

FIG. 6B shows in magnified form one portion of memory array 46 in FIG. 6A. The numbering of the subarrays, stack sets, and bank select lines is clearly set forth. Also shown is the placement of the odd and even row bus lines, which are coupled by way of bus loading limiters 24 into subarrays either side of the odd or even row buses. With the sharing of row bus lines by successively numbered stack sets, and the presence of limiters 24 between the row bus lines and the row lines in subarrays, the preferred arrangement of the bank select lines is shown in FIG. 6B to involve a reversal of such lines for each four adjacent subarrays. Again, the architecture successfully ensures that no two bit positions in a common data word commonly share the same row line and same bank select lines.

The correction of single bit errors in 32 bit data words is performed using the function blocks depicted in FIG. 7. Since the concepts and circuits for error correction are well known by those skilled in the art, FIG. 7 depicts only the major functional elements which serve to convey the fundamental concepts of error correction. As shown, data bus 47 is composed of 38 lines, including 32 word bit lines and 6 check bit lines, and is connected through XOR trees 49 to generate 6 syndromes. The syndromes contain information not only as to the presence of an error in the 32 bit word, but also as to its location. Syndrome decoder block 51 decodes the syndrome information to select which if any of the data bits need to be corrected. Correction of the data bits is performed in exclusive OR blocks 52, which combine a feed-forward of the 32 word bit lines with the syndrome results in the respective exclusive OR blocks 52. The outcome is a 32 bit error corrected word.

The present invention in its varying facets has been described in general and shown by way of various embodiments. It should be understood that the fundamental concepts upon which the invention is based are broader than the specific embodiments shown and described herein. For instance, though the invention has been described with reference to a read only memory, the fundamental concepts of the invention are broadly applicable to memories of other types, such as random access memories, which otherwise include the fundamental features of the presently disclosed invention. In like manner, though the architecture has been applied to ROM arrays comprised of NAND connected stacks of field effect transistors, the concept is neither limited to that physical arrangement that logic, nor that particular class of active electronic devices.

I claim:

1. A memory array having addressable data storage cells and comprised of:

a first section, having first and second subsections and providing information for a first data bit position upon addressing by first and second select signals;

a second section, having first and second subsections and providing information for a second data bit position upon addressing by first and third select signals;

signal means for providing first select signals to address the subsections of the first and second sections, second select signals to address alternate subsections of the first section, and third select signals to address alternate subsections of the second section.

2. The memory array recited in claims 1, further comprising:

a third section, having first and second subsections and providing information for the second data bit position upon addressing by the first and the second select signals; and means for isolating a defect in a section which is responsive to the first select signals provided to the first to second sections to prevent degradation of the first select signals provided to the third section.

3. The memory array recited in claim 2, wherein:

the first, second and third sections each include third and fourth subsections, which third and fourth subsections are addressable by select signals to provide information for the respective data bit positions; and means for selectively addressing between the first and second subsections and the third and fourth subsections in the first, second and third sections to provide information for the respective data bit positions.

4. The memory array recited in claim 1, 2 or 3, further comprising:

means for correcting an error in a data bit position, coupled to receive the data bits from the sections.

5. The memory array recited in claim 1, 2 or 3, further comprising:

an error correction code memory;

means for addressing data in the error correction code memory in concurrence with select signals; and logic means for correcting an error in a data bit position using data from the error correction code memory.

6. A memory array having addressable data storage cells and suitable for providing data bit words upon addressing by row and bank select lines, comprised of:

a first stack set, having first and second stacks of cells and providing data representing a first data bit position upon addressing by the row lines and the first set of bank select lines;

a second stack set, having first and second stacks of cells and providing data representing a second data bit position upon addressing by the row lines and a second set of bank select lines; and signal means for addressing cells in the first and second stack sets using the row lines, cells in alternate stacks of the first stack set using the first set of bank select lines, and cells in alternate stacks of the second stack set using the second set of bank select lines.

7. The memory array recited in claim 6, further comprising:
a third stack set, having first and second stacks of cells and providing data representing the second data bit position upon addressing by the row lines and the first set of bank select lines, and
means for isolating a defect in a stack set which is responsive to the row lines connected to the first of second stack sets to prevent degradation in addressing by the row lines connected to the third stack set.

8. The memory array recited in claim 7, wherein:
the first, second and third stack sets each include third and fourth stacks, which third and fourth stacks are addressable by select signals to provide data for the respective data bit positions upon addressing; and
means for selectively addressing between the first and second stacks and the third and fourth stacks in the first, second and third stack sets to provide information for the respective date bit positions.

9. The memory array recited in claim 8, wherein the stacks are comprised of field effect transistors arranged in a NAND logic configuration.

10. The memory array recited in claim 6, 7, 8 or 9, further comprising:
means for correcting an error in a data bit position, coupled to receive the data bits from the stack sets.

11. The memory array recited in claim 6, 7, 8 or 9, further comprising:
an error correction code memory;
means for addressing data in the error correction code memory with select signals; and
logic means for correcting an error in a data bit position using data from the error correction code memory.

12. The memory array recited in claim 6, 7, 8 or 9, wherein the addressable storage cells are non-volatily programmed field effect transistors.

13. The memory array recited in claim 12, wherein the means for selectively addressing between the first and second stacks is comprised of series connected depletion and enhancement type field effect transistors in each stack, addressed by common lines to operate the stacks alternately.

14. A memory array having addressable data storage cells and comprised of:
a first section providing information for a first data bit position upon addressing by first and second select signals;
a second section providing information for a second data bit position upon addressing by first and third select signals;
a third section providing information for the second data bit position upon addressing by first and second select signals;
a fourth section providing information for the first data bit position upon addressing by first and third select signals; and
signal means for providing first, second and third select signals to address information for the first and second data bit positions.

15. The memory array recited in claim 14, further comprising:
means for isolating a defect in a section which is responsive to the first select signals provided to one section to prevent degradation of the first select signals provided to another section.

16. The memory array recited in claim 14 or 15, further comprising:
means for correcting an error in a data bit position, coupled to receive the data bits from the sections.

17. The memory array recited in claim 14 or 15, further comprising:
an error correction code memory;
means for addressing data in the error correction code memory in concurrence with select signals; and
logic means for correcting an error in a data bit position using data from the error correction code memory.

* * * * *